United States Patent
Lin et al.

(10) Patent No.: US 6,667,508 B2
(45) Date of Patent: Dec. 23, 2003

(54) NONVOLATILE MEMORY HAVING A SPLIT GATE

(76) Inventors: Horng-Chih Lin, 11F-3, No. 2-1, Lane 89, Ssu-Wei Rd., Hsinchu (TW); Tiao-Yuan Huang, 7-1 Floor, No. 25, Gwung Chung First Rd., East District, HsinChu (TW)

(*) Notice: Subject to any disclaimer, the term of this patent is extended or adjusted under 35 U.S.C. 154(b) by 0 days.

(21) Appl. No.: 10/020,916

(22) Filed: Dec. 19, 2001

(65) Prior Publication Data
US 2002/0163032 A1 Nov. 7, 2002

(30) Foreign Application Priority Data
May 3, 2001 (TW) .................................. 90110594 A

(51) Int. Cl.$^7$ .............................................. H01L 29/788
(52) U.S. Cl. .................. 257/315; 257/316; 257/317; 257/321
(58) Field of Search ................................ 257/315, 316, 257/317, 321, 319, 320, 314; 438/257, 263, 264

(56) References Cited

U.S. PATENT DOCUMENTS 6,166,410 A * 12/2000 Lin et al. .................... 257/324
6,294,808 B1 * 9/2001 Yu .............................. 257/317

* cited by examiner

Primary Examiner—Thien Tran
(74) Attorney, Agent, or Firm—Birch, Stewart, Kolasch & Birch, LLP

(57) ABSTRACT

A novel structure of nonvolatile memory is formed on p type silicon and includes a stacked gate, a tunneling dielectric layer, a floating gate (FG), a dielectric layer and a control gate (CG). One side of the stacked gate has a source region and the other has a drain region, wherein the surface of the source region includes a thin metal silicide connected with a channel region to form a Schottky barrier. A tilted angle implant with As or P doping is performed on the p type silicon substrate to form a drain region and extend a portion of the drain region to a channel region under the stacked gate. For implanting, an n doped source region is also formed, creating an offset between the source region and the channel region as a result of the tilted angle implant. For programming, the source region is grounded, positive voltage is applied to the drain region and the gate, such that the hot carriers inject into the floating gate through the channel adjacent to the source region.

6 Claims, 15 Drawing Sheets

NONVOLATILE MEMORY HAVING A SPLIT GATE

BACKGROUND OF THE INVENTION

1. Field of the Invention

The present invention generally relates to nonvolatile memories. More specifically, the present invention provides a novel structure of nonvolatile memory and a method of manufacturing the same.

2. Description of the Related Art

Nonvolatile memory is a kind of memory device in which the stored data is not lost when powered off. There are several nonvolatile memory cell using semiconductors such as flash and electrically erasable programmable read-only memory (EEPRON) etc. In recent years, the market for nonvolatile memory has grown rapidly as a result of the need for mobile phones and network communication etc.

There are several popular nonvolatile memory cell structures. The first nonvolatile memory cell is the so-called stacked gate nonvolatile cell, as depicted in FIG. 1 (Prior Art). In FIG. 1, numeral 1 represents a p type silicon substrate. Numeral 2 represents a tunneling dielectric layer formed on the silicon substrate generally consisting of a $SiO_2$ layer, while SiON, $Si_3N_4$, $HfO_2$ or $ZrO_2$ can also be employed. Numeral 3 represents a floating gate (FG) formed on the tunneling dielectric layer generally consisting of polysilicon. Numeral 4 represents a dielectric layer formed on the floating gate generally consisting of $SiO_2$, ONO, SiON, $Si_3N_4$, $HfO_2$ or $ZrO_2$. Numeral 5 represents a control gate (CG) formed on the dielectric layer. A capping dielectric layer 6 may be formed on the upper portion of the control gate (CG) 5 according to the demand. Each sidewall of the stacked gate has a spacer 7 generally consisting of an oxide or nitride. One side of the stacked gate has an n doped source region 8 and another side has an n doped drain region 9. In erasing, the stacked gate nonvolatile cell can be erased by F-N tunneling effect through the source region 8, the drain region 9 or the silicon substrate 1 to release electrons trapped in the floating gate 3.

Another conventional cell structure, referred to as the split gate memory cell, as shown in FIG. 2 (Prior Art). In FIG. 2, numeral 11 represents a p type silicon substrate. Numeral 12 represents a tunneling dielectric layer formed on the silicon substrate. Numeral 13 represents a floating gate (FG) formed on the tunneling dielectric layer generally consisting of polysilicon. Numeral 14 represents a dielectric layer formed on the floating gate generally consisting of an ONO. Numeral 15 represents a control gate (CG) formed on the dielectric layer. One portion of the control gate 15 is located over the floating gate 13, while another portion of the control gate 15 is extended on the silicon substrate 11, the tunneling dielectric layer 12 and the dielectric layer 14. One side of the split gate has an n doped source region 18 and another side has an n doped drain region 19. In erasing, the split gate nonvolatile cell can be erased by F-N tunneling effect through the drain region 19 or the silicon substrate 11 to release electrons trapped in the floating gate 13. Alternately, positive voltage is applied to the control gate 15 thus the electron trapped in the floating gate 13 is released.

In programming, a scheme of so-called channel hot-carrier injection is usually employed by the above conventional stacked gate and split gate memory cells. In detail, the source region is grounded, positive voltage is applied to the drain region and the gate, and therefore the hot carriers inject into the floating gate through the channel adjacent to the drain region. However, this programming procedure has a main disadvantage, hot carrier creation inefficiency, therefore a higher voltage is needed to abbreviate the programming time.

Ken Uchida et al. disclosed a new scheme of hot-carrier injection in Applied Physics Letters (76 (27), p. 3992, Jun. 21, 2000). A metal silicide is employed as a source region of a device and connects with a channel region to form a Schottky barrier. As demonstrated by the experiments, hot carriers can inject into a gate through the channel region adjacent to the source region. This scheme is more efficient then conventional schemes, therefore the programming voltage can be lower. However, this structure has an essential disadvantage when applied in nonvolatile memory unit. Since the source region is a metal silicide, a reading current is limited by the Schottky barrier resulting in shrinkage when reading. Otherwise, if a drain region is a metal silicide, a huge junction leakage will occur when operating.

SUMMARY OF THE INVENTION

Therefore, an object according to the present invention is to provide a novel structure of nonvolatile memory and a method of manufacturing the same with a metallic source to achieve source-side hot electron injection to solve the above-mentioned problems of the programming of conventional structures. Another object according to the present invention is to create a Schottky contact formed only at a contact of the metallic source and the channel of a device, then a highly n doped region is formed at a contact of a lower portion of the metallic source and a p type substrate and at a drain junction of a drain and the p type substrate, respectively, thereby further improving the reading current of the cell and avoiding large junction leakage.

The present invention achieves the above-indicated objects by providing a novel structure of nonvolatile memory that is formed on p type silicon. This memory cell includes a stacked gate a tunneling dielectric layer, a floating gate (FG), a dielectric layer and a control gate (CG). One side of the stacked gate has a source region and another side has an drain region, wherein the surface of the source region includes a thin metal silicide connecting with a channel region to form a Schottky barrier. A tilted angle implant with As or P doping is performed on the p type silicon substrate to form a drain region and extend a portion of the drain region to a channel region under the stacked gate. In implanting, an n doped source region is also formed by some dosage, creating an offset between the source region and the channel region as a result of the tilted angle implant. In programming, the source region is grounded, positive voltage is applied to the drain region and the gate, therefore, the hot carriers inject into the floating gate through the channel adjacent to the source region.

The present invention also provides another novel structure of nonvolatile memory that is made on p type silicon. This memory cell includes a split gate a tunneling dielectric layer, a floating gate (FG), a dielectric layer and a control gate (CG). One side of the split gate has a source region and another side has an drain region, wherein the surface of the source region includes a thin metal silicide connecting with a channel region to form a Schottky barrier. A tilted angle implant with As or P doping is performed on the p type silicon substrate to form an drain region and extend a portion of the drain region to a channel region under the split gate. In implanting, an n doped source region is also formed by some dosage, creating an offset between the source region and the channel region as a result of the tilted angle implant.

In programming, the source region is grounded, positive voltage is applied to the drain region and the gate, and therefore the hot carriers inject into the floating gate through the channel adjacent to the source region.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
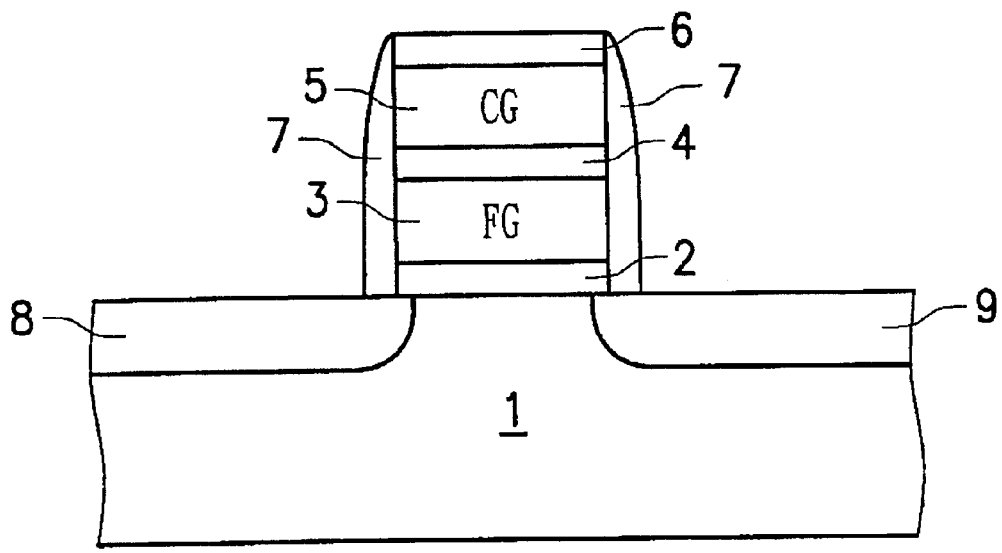
FIG. 1 (Prior Art) is a cross-section of a conventional stacked gate nonvolatile memory cell.
Figure 2:
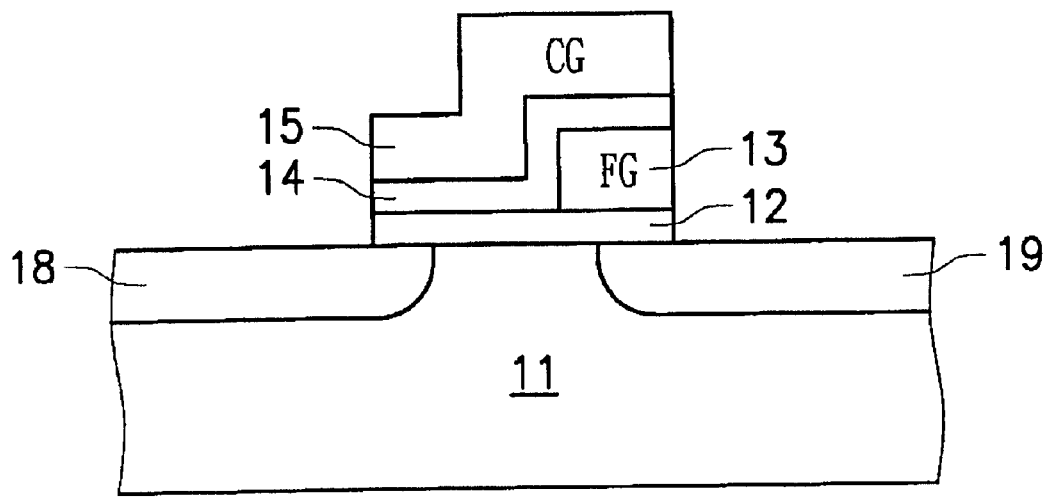
FIG. 2 (Prior Art) is a cross-section of a conventional split gate nonvolatile memory cell.
Figure 3:
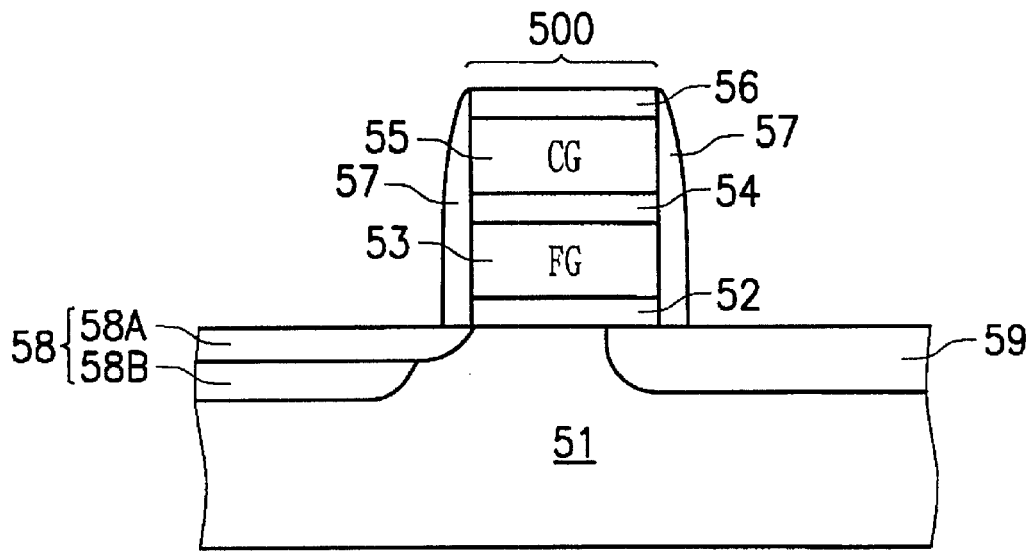
FIG. 3 is a cross-section of a stacked gate nonvolatile memory cell according to the invention.

FIG. 3 is a cross-section of a structure of nonvolatile memory according to the invention. The device is formed on p type silicon 51 and includes a stacked gate 500 a tunneling dielectric layer 52, a floating gate (FG) 53, a dielectric layer 54 and a control gate (CG) 55. A capping dielectric layer 56 may be formed on the upper portion of the control gate (CG) 55 according to the demand. Each sidewall of the stacked gate 500 has a spacer 57 generally consisting of an oxide or nitride. One side of the stacked gate 500 has a source region 58 and another side has an n doped drain region 59, wherein the source region 58 includes a thin metal layer 58A generally consisting of a silicide and an n doped source region 58B under the metal layer 58A. The metal layer 58A connects with a channel region under the stacked gate 500 to form a Schottky barrier.

Figure 4:
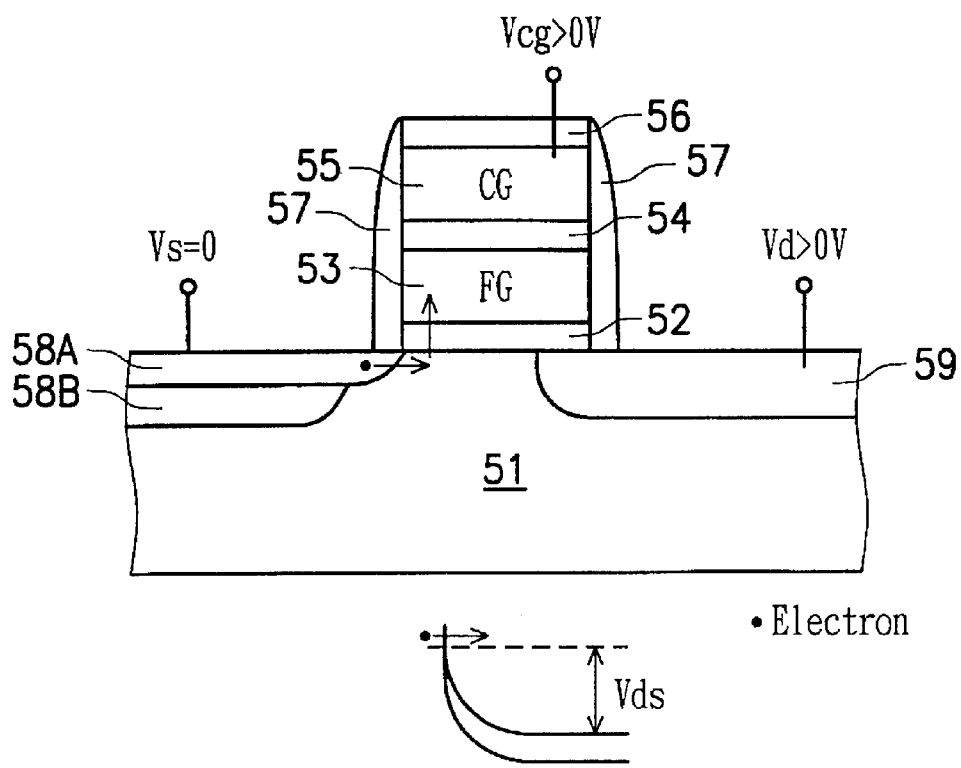
FIG. 4 is a cross-section of the stacked gate nonvolatile memory cell being programmed according to the present invention.

In programming, a scheme shown in FIG. 4 can be used, the source region 58 is grounded, positive voltage is applied to the control gate (CG) 55 and the drain region 59. The band diagram from the metal layer 58A of the source region 58 to the drain region 59 is shown in the lower portion of FIG. 4. It can be seen while the electron passed through the Schottky barrier, the electron can gain high energy and convert to a hot-electron, then inject into the floating gate (FG) 53.

Figure 5:
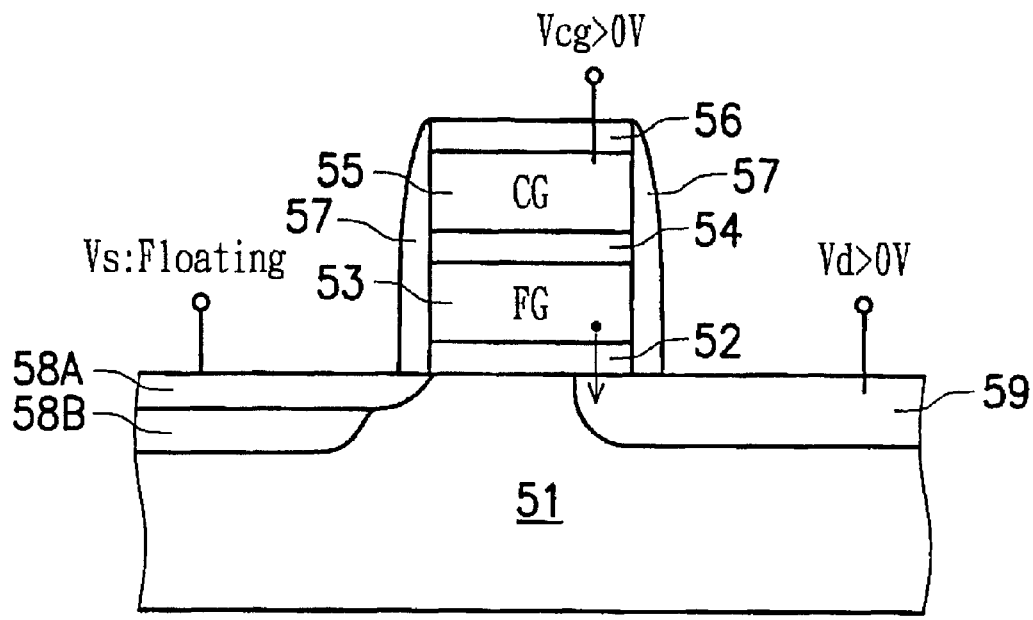
FIG. 5 is a cross-section of the stacked gate nonvolatile memory cell being erased according to the present invention.

In erasing, a scheme shown in FIG. 5 can be used, the source region 58 is floated, a negative voltage is applied to the control gate (CG) 55 and positive voltage on the drain region 59. The electron in the floating gate (FG) 53 passes through the drain region 59 and is released. Alternatively, positive voltage is applied to the silicon substrate 51 thus the electron in the floating gate (FG) 53 is passed through the silicon substrate 51 and released.

Figure 6:
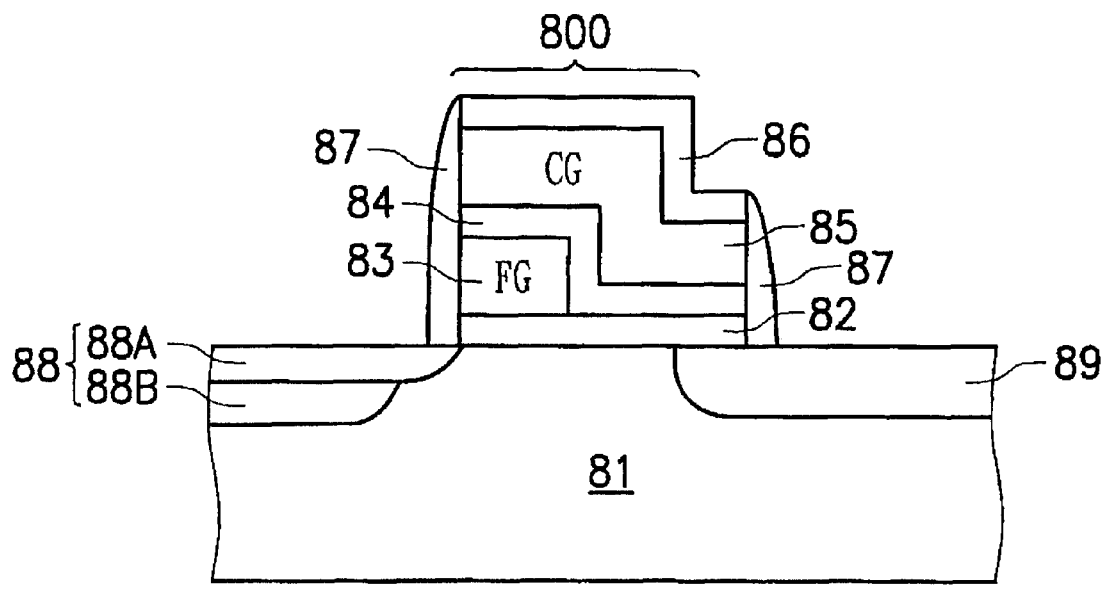
FIG. 6 is a cross-section of a split gate nonvolatile memory cell according to the invention.

FIG. 6 is a cross-section of another structure of nonvolatile memory according to the invention. The device is formed on p type silicon 81 and includes a split gate 800 a tunneling dielectric layer 82, a floating gate (FG) 83, a dielectric layer 84 and a control gate (CG) 85. A capping dielectric layer 86 may be formed on the upper portion of the control gate (CG) 85 according to demand. Each sidewall of the split gate 800 has a spacer 87 generally consisting of an oxide or nitride. The floating gate (FG) 83 is located under the control gate (CG) 85 adjacent to a source region 88. One side of the split gate 800 has the source region 88 and another side has an n doped drain region 89, wherein the source region 88 includes a thin metal layer 88A generally consisting of a silicide and an n doped region 88B under the metal layer 88A. The metal layer 88A connects with a channel region under the split gate 800 to form a Schottky barrier.

The actions of the programming of the above structure are similar to the scheme shown in FIG. 4. In erasing, positive voltage is applied to the control gate (CG) 85 thus the electron in the floating gate (FG) 83 is passed through the control gate (CG) 85 and released.

In some designs, an erase gate can be added and isolated with the floating gate via a dielectric layer. In erasing, positive voltage is applied to the erase gate thus the electron in the floating gate (FG) 83 is passed through the erase gate and released. The erase gate may not be the same object as the control gate. The tunneling dielectric layer of the structure of nonvolatile memory according to the invention generally consists of a $SiO_2$ layer, while SiON, $Si_3N_4$, $HfO_2$ or $ZrO_2$ can also be employed. The floating gate is preferably polysilicon. The dielectric layer is preferably $SiO_2$, ONO, SiON, $Si_3N_4$, $HfO_2$ or $ZrO_2$. The control gate is preferably polysilicon, metal or polysilicon/metal stacked layers. If the control gate is metal, then $WSi_2$, $CoSi_2$, $TiSi_2$, W, W/WN or W/TiN can be employed. The surface metal portion of the source region is preferably metal silicide. The capping dielectric layer formed on the control gate is preferably SiON or $Si_3N_4$. A metal silicide can further be formed in the drain region and surrounded by highly n doped region.

Following are some embodiments that can accomplish the above structures of nonvolatile memory.

Embodiment 1

FIGS. 7a–7e are cross-sections of process steps used to form a structure of nonvolatile memory in accordance with embodiment 1 according to the present invention.

Figure 7A:
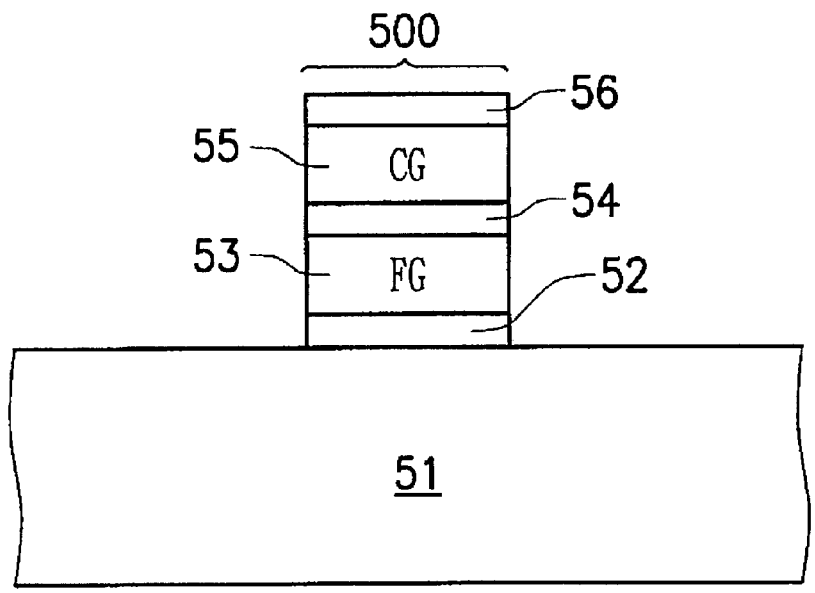
FIGS. 7a through 7e illustrate, in cross section, the process of embodiment 1 and embodiment 4 according to the present invention.

This embodiment begins by providing a p type silicon substrate 51 having a stacked gate 500. The stacked gate 500 is comprised of a tunneling dielectric layer 52, a floating gate (FG) 53, a dielectric layer 54, a control gate (CG) 55 and a capping dielectric layer 56 as shown in FIG. 7a.

Figure 7B:
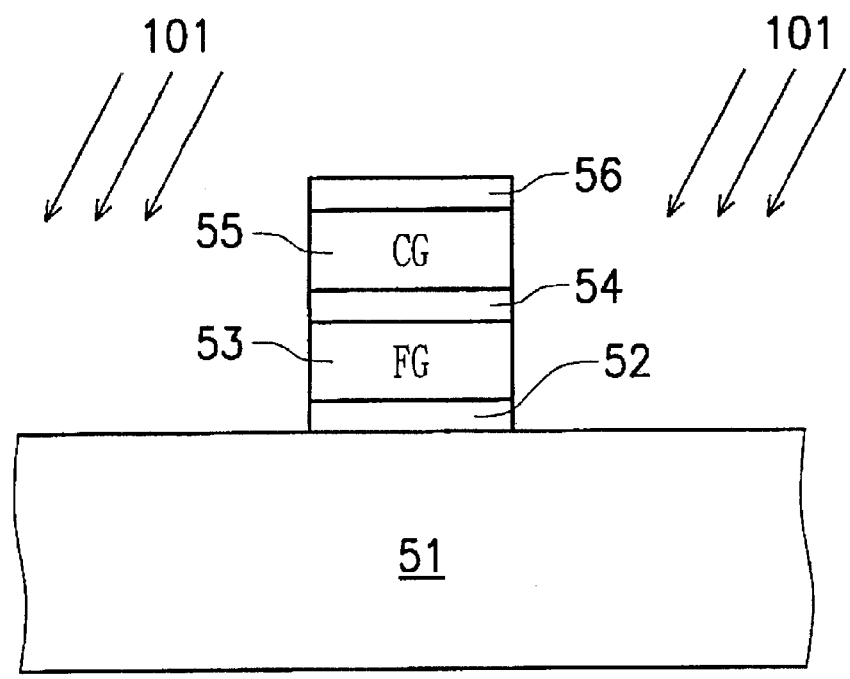
Figure 7C:
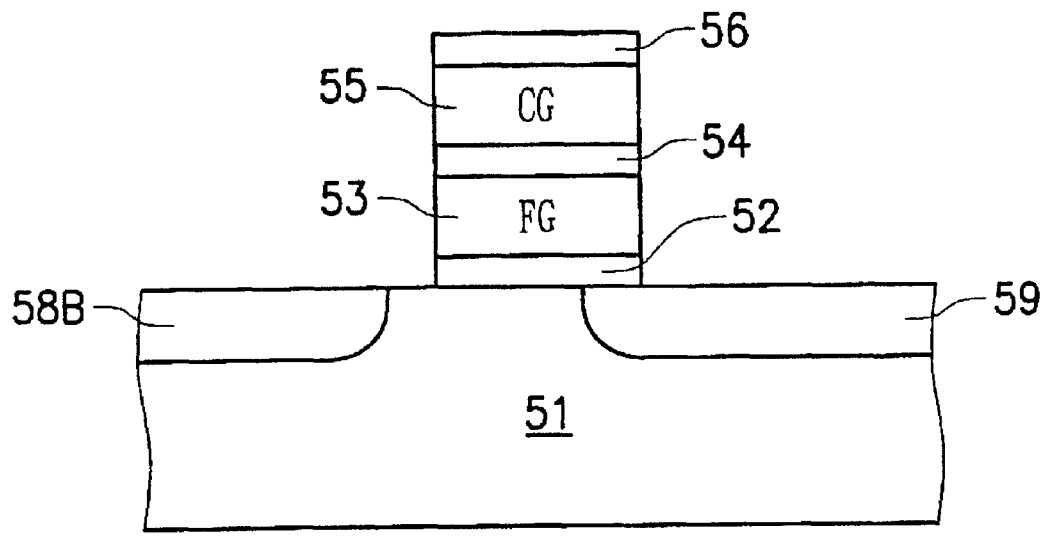

Referring to FIG. 7b, a tilted angle implant 101 with As or P doping is performed on the p type silicon substrate 51 to form an n doped drain region 59 and extend a portion of the drain region 59 to a channel region under the stacked gate 500, as shown in FIG. 7c. In implanting, an n doped source region 58B is also formed by some dosage. An offset is then formed between the n doped source region 58B and the channel region under the stacked gate 500.

Angle □ of the tilted angle implant 101 can be 15 to 75 degrees, preferably 30 to 60 degrees. Dosage of the tilted angle implant 101 is between $10^{15}$ and $2\times10^{16}$ cm$^{-2}$, preferably between $2\times10^{15}$ and $2\times10^{16}$ cm$^{-2}$. Energy of the tilted angle implant 101 is between 10 and 150 keV, preferably between 20 and 100 keV.

An annealing treatment is then performed to activate the doping element, as shown in FIG. 7c. For example, the annealing is performed at between 700 and 950° C. with an inert gas (N$_2$ or Ar) ambient in a furnace for 10 minutes to an hour or at between 800 and 1050° C. with an inert gas (N$_2$ or Ar) ambient in a rapid thermal reactor for 1 to 60 seconds.

Figure 7D:
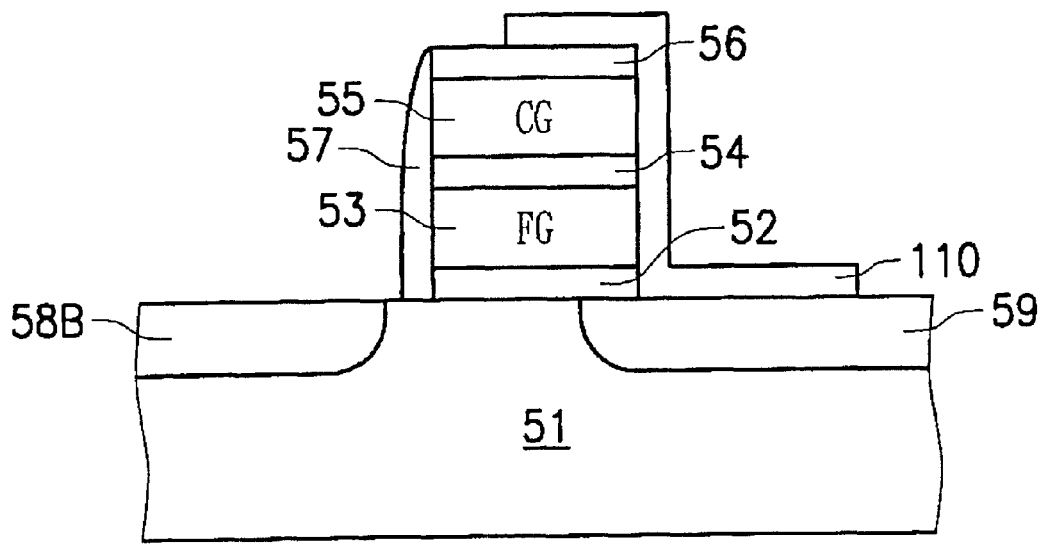

Next, a dielectric layer 110 is formed and patterned on the stacked gate 500 and the drain region 59, as shown in FIG. 7d. The dielectric layer 110 is preferably formed by LPCVD. An isotropically reactive ion etching (RIE) is employed to etch the dielectric layer 110, and thus a spacer 57 is formed on a sidewall adjacent to the source region 58B of the stacked gate 500. The dielectric layer 110 and the spacer 57 are generally an oxide or nitride. The spacer 57 preferably has a lateral width of 5 to 50 nm.

The silicon of the silicon substrate 51 is used as etch stop during etching of the dielectric layer 110. Sometimes, in order to form a metal source 58A near the channel region under the stacked gate 500, a portion of the silicon can be intentionally etched (not shown) preferably to a depth of 3 to 20 nm.

Figure 7E:
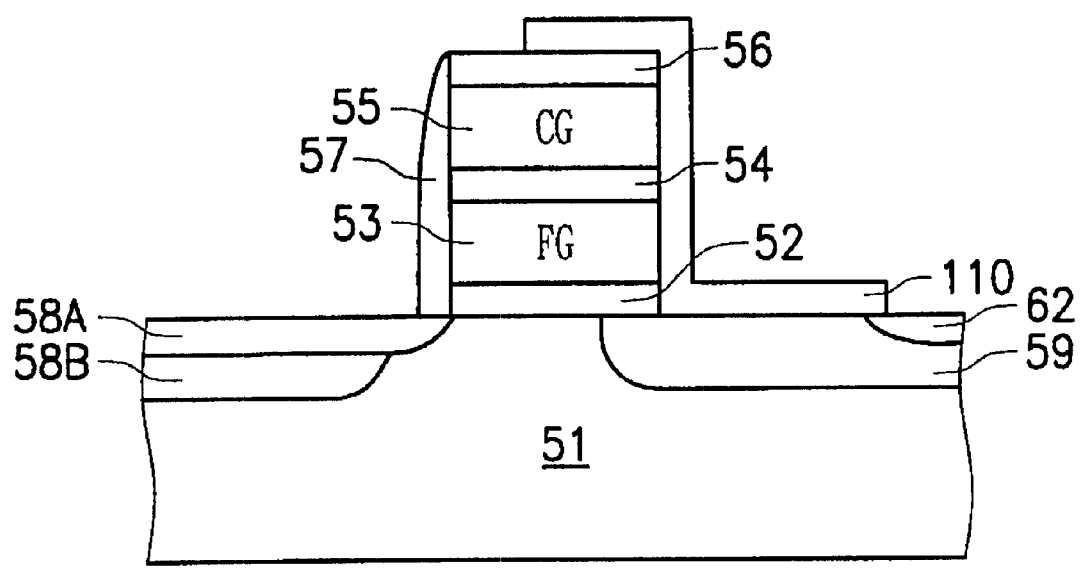

Next, a metal silicide is formed to be the metal source 58A by a self-aligned silicidation or SALICIDE process, as shown in FIG. 7e. The SALICIDE process generally includes the following steps:

(1) A metal layer is formed on the silicon substrate 51, the source region 58B, the drain region 59, the stacked gate 500, the dielectric layer 110 and the spacer 57. Alternately, the metal layer can be formed only on the exposed portions of two edges of the silicon substrate 51. The metal layer is preferably formed of Pt, Ti, Ni, Co or Er by a physical vapor deposition (PVD) or chemical vapor deposition (CVD) process and has a thickness of 5 to 30 nm.

(2) A heat treatment is performed to make portions of the source region 58B, the drain region 59 and the silicon substrate 51 uncovered by the third dielectric layer 110 to form metal silicide, thus the metal source 58A and a metal silicide 62 over the drain region 59 are defined. The metal silicide 62 is surrounded by highly n doped drain region 59 so actions of the device will not be affected. The heat treatment is performed at between 250 and 500° C. with an inert gas (N$_2$ or Ar) ambient in a furnace for 10 minutes to 2 hour or at between 500 and 800° C. with an inert gas (N$_2$ or Ar) ambient in a rapid thermal reactor for 30 seconds to 2 minutes.

(3) Unreacted portions of the metal layer are removed. A mixture of H$_2$SO$_4$ and H$_2$O$_2$ or a mixture of NH$_4$OH, H$_2$O$_2$, and H$_2$O are used as the etchant to selectively wet etch the residual metal layer, and the result is illustrated in FIG. 7e.

Embodiment 2

FIGS. 7a to 7c show the same processes and steps as those in the first embodiment, wherein each part with the same denotation possesses the same function.

Figure 8A:
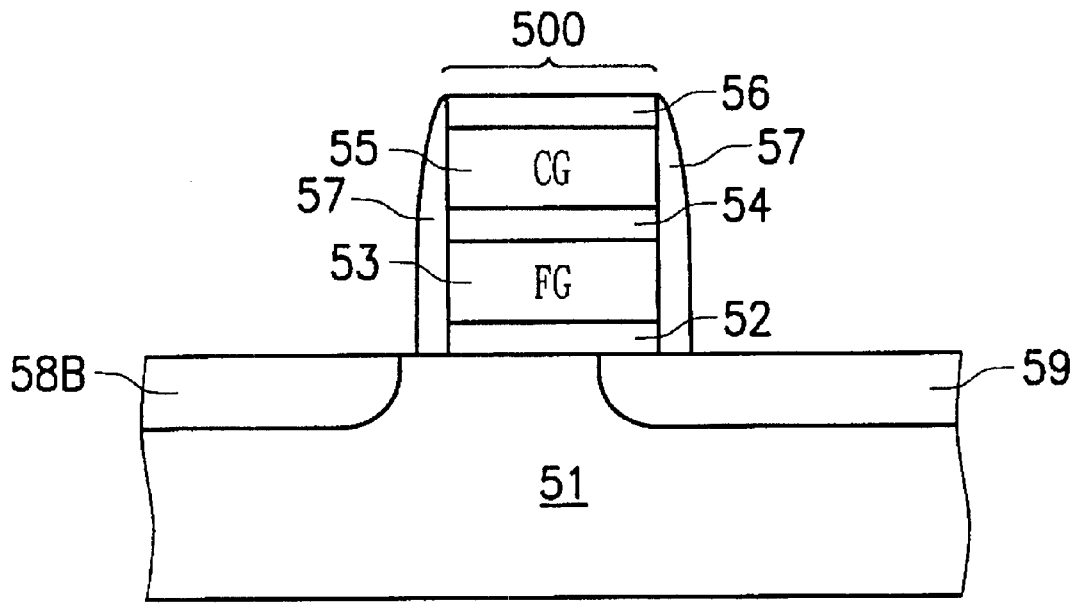
FIGS. 8a through 8b illustrate, in cross section, the process of embodiment 2 according to the present invention.

Next, a dielectric layer is formed and patterned to form sidewall spacers 57 adjacent to each sidewall of the stacked gate 500, as shown in FIG. 8a. The dielectric layer is preferably formed by LPCVD. Anisotropically reactive ion etching (RIE) is employed to etch the dielectric layer. The spacers 57 are generally an oxide or nitride. The spacers 57 preferably have a lateral width of 5 to 50 nm.

The silicon of the silicon substrate 51 is used as etch stop during etching of the dielectric layer. Sometimes, in order to form a metal source 58A near the channel region under the stacked gate 500, a portion of the silicon can be intentionally etched (not shown) preferably to a depth of 3 to 20 nm.

Figure 8B:
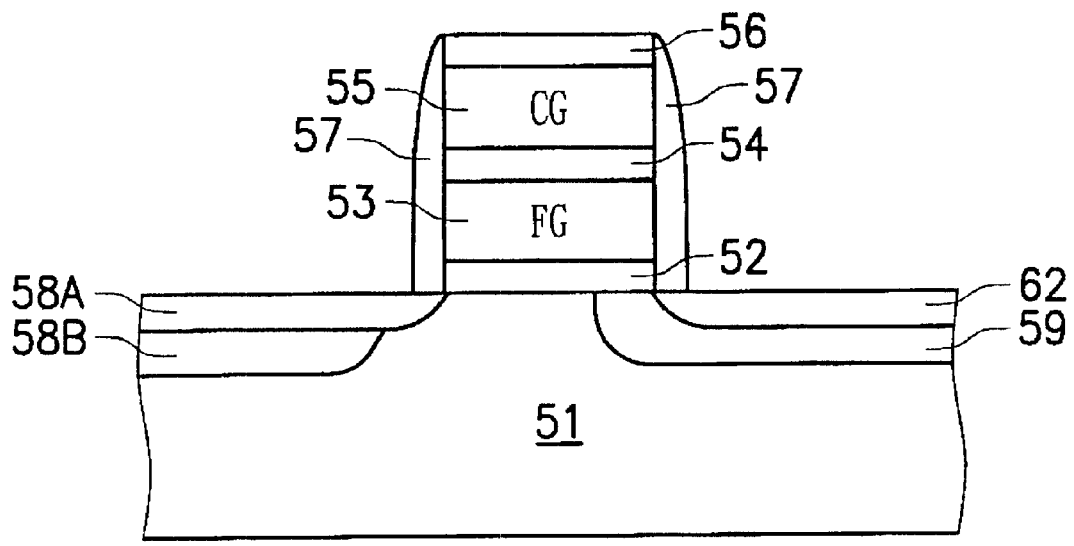

Next, a metal silicide is formed to be the metal source 58A by a self-aligned silicidation or SALICIDE process, as shown in FIG. 8b. Thus, a portion of the drain region 59 uncovered by the spacer 57 is then converted to a metal silicide 62. The metal silicide 62 is surrounded by highly n doped drain region 59 so actions of the device will not be affected.

Embodiment 3

FIGS. 9a–9e are cross-sections of process steps used to form a structure of nonvolatile memory in accordance with embodiment 3 according to the present invention.

Figure 9A:
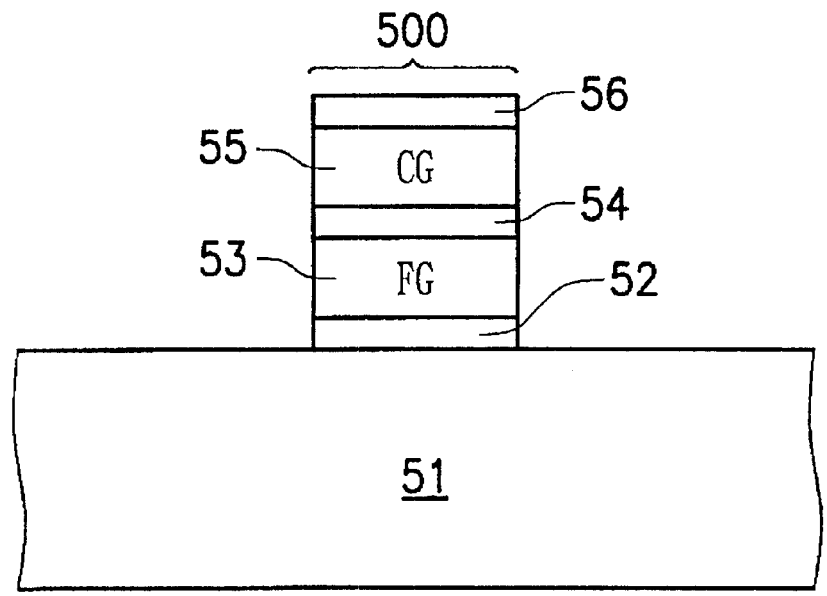
FIGS. 9a through 9e illustrate, in cross section, the process of embodiment 3 according to the present invention.

This embodiment begins by providing a p type silicon substrate 51 having a stacked gate 500. The stacked gate 500 is comprised of a tunneling dielectric layer 52, a floating gate (FG) 53, a dielectric layer 54, a control gate (CG) 55 and a capping dielectric layer 56 as shown in FIG. 9a.

Figure 9B:
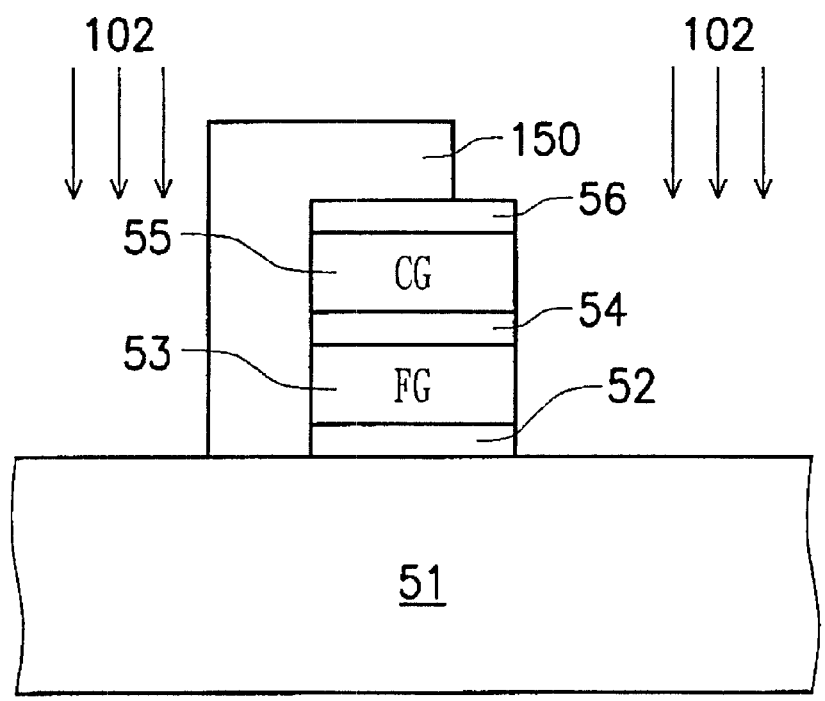
Figure 9C:
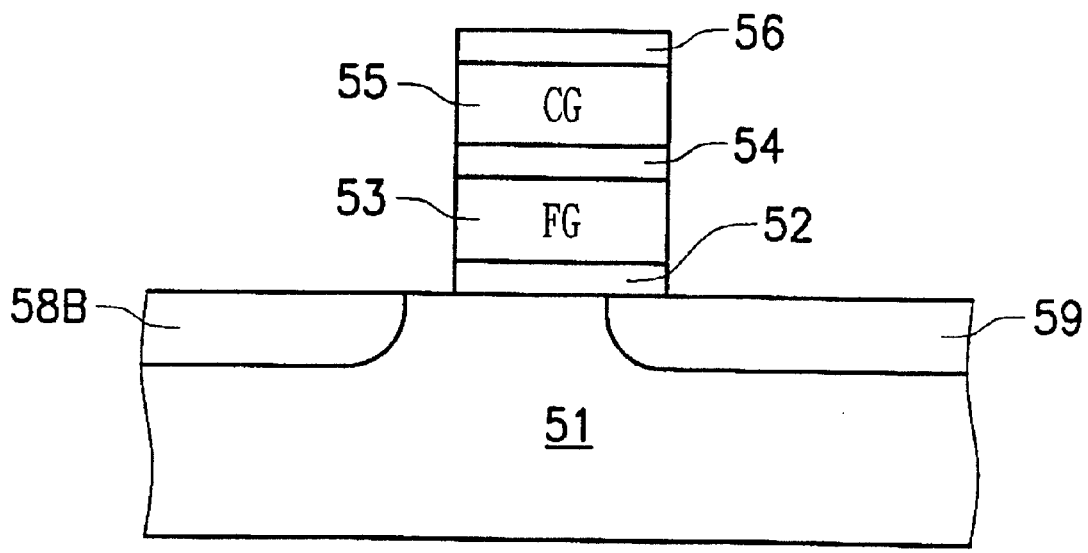

Referring to FIG. 9b, a mask layer 150 is formed on the p type silicon substrate 51. A portion of the stacked gate 500 adjacent to a source region of the p type silicon substrate 51 and a portion of the source region adjacent to the stacked gate 500 are covered by the mask layer 150. An implant 102 with As or P doping is performed on the p type silicon substrate 51 to form an n doped drain region 59 and extend a portion of the drain region 59 to a channel region under the stacked gate 500, as shown in FIG. 9c. In implanting, an n doped source region 58B is also formed. An offset is created between the n doped source region 58B and the channel region under the stacked gate 500.

Angle □ of the tilted angle implant 102 can be 0 to 45 degrees, preferably 0 to 15 degrees. Dosage of the tilted angle implant 102 is between $10^{15}$ and $2\times10^{16}$ cm$^{-2}$, preferably between $2\times10^{15}$ and $2\times10^{16}$ cm$^{-2}$. Energy of the tilted angle implant 102 is between 10 and 150 keV, preferably between 20 and 100 keV.

An annealing treatment is then performed to activate the doping element, as shown in FIG. 9c. For example, the annealing is performed at between 700 and 950° C. with an inert gas (N$_2$ or Ar) ambient in a furnace for 10 minutes to an hour or at between 800 and 1050° C. with an inert gas (N$_2$ or Ar) ambient in a rapid thermal reactor for 1 to 60 seconds.

Figure 9D:
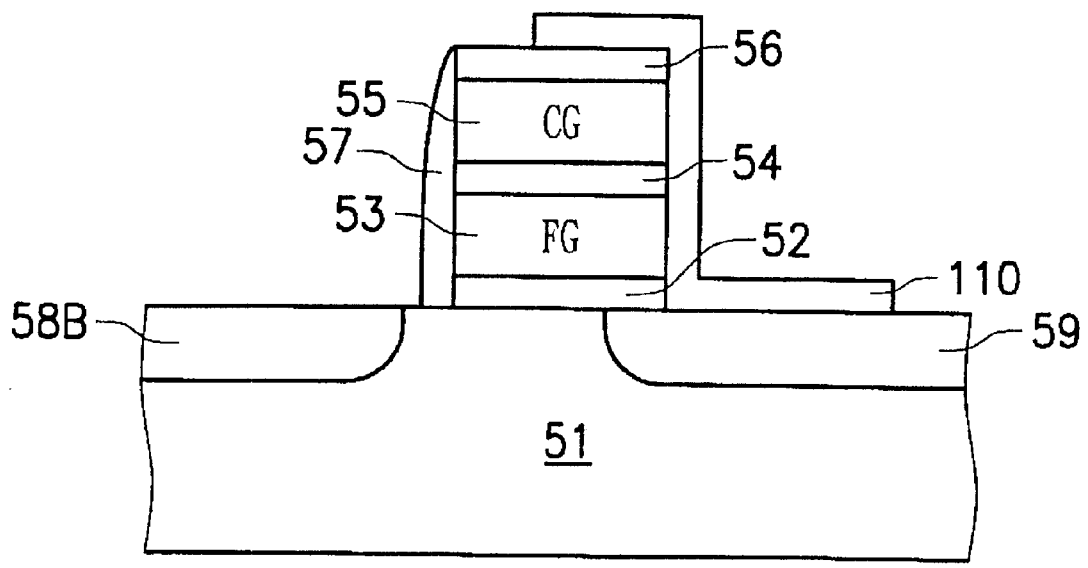

Next, a dielectric layer 110 is formed and patterned on the stacked gate 500 and the drain region 59, as shown in FIG. 9d. The dielectric layer 110 is preferably formed by LPCVD. Anisotropically reactive ion etching (RIE) is employed to etch the dielectric layer 110, and thus a spacer 57 is formed on a sidewall adjacent to the source region 58B of the stacked gate 500. The dielectric layer 110 and the spacer 57 are generally an oxide or nitride. The spacer 57 preferably has a lateral width of 5 to 50 nm.

The silicon of the silicon substrate 51 is used as etch stop during etching of the dielectric layer 110. Sometimes, in order to form a metal source 58A near the channel region under the stacked gate 500, a portion of the silicon can be intentionally etched (not shown) preferably to a depth of 3 to 20 nm.

Figure 9E:
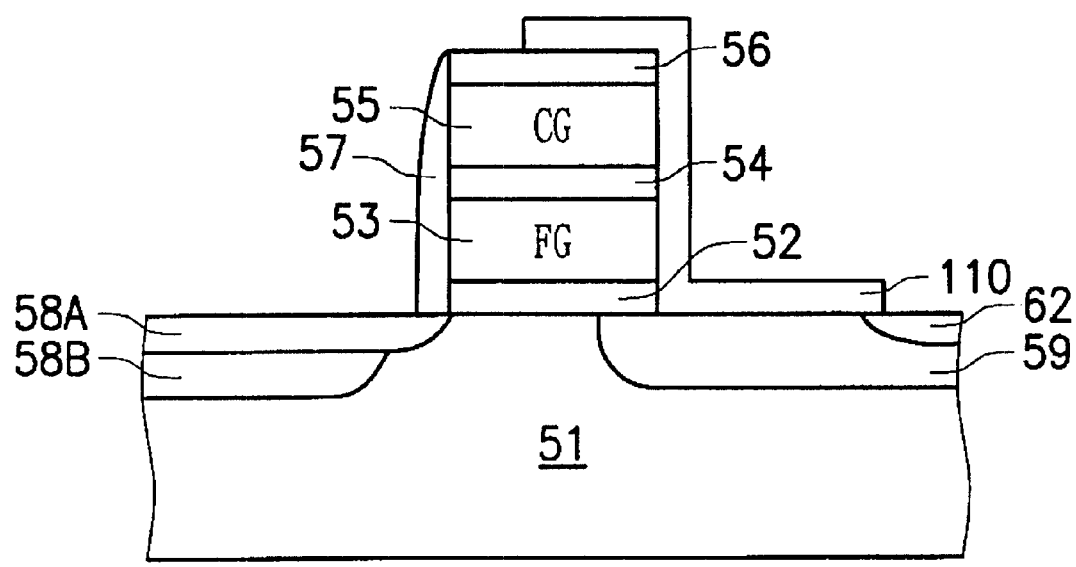

Next, a metal silicide is formed to be the metal source 58A by a self-aligned silicidation or SALICIDE process, as shown in FIG. 9e. The SALICIDE process generally includes the following steps:

(1) A metal layer is formed on the silicon substrate 51, the source region 58B, the drain region 59, the stacked gate 500, the dielectric layer 110 and the spacer 57. Alternately, the metal layer can be formed only on the exposed portions of two edges of the silicon substrate 51. The metal layer is preferably formed of Pt, Ti, Ni, Co or Er by a physical vapor deposition (PVD) or chemical vapor deposition (CVD) process and has a thickness of 5 to 30 nm.

(2) A heat treatment is performed to make portions of the source region 58B, the drain region 59 and the silicon substrate 51 uncovered by the third dielectric layer 110 to form metal silicide, thus the metal source 58A and a metal silicide 62 over the drain region 59 are defined. The metal silicide 62 is surrounded by highly n doped drain region 59 so actions of the device will not be affected. The heat treatment is performed at between 250 and 500° C. with an inert gas ($N_2$ or Ar) ambient in a furnace for 10 minutes to 2 hour or at between 500 and 800° C. with an inert gas ($N_2$ or Ar) ambient in a rapid thermal reactor for 30 seconds to 2 minutes.

(3) Unreacted portions of the metal layer are removed. A mixture of $H_2SO_4$ and $H_2O_2$ or a mixture of $NH_4OH$, $H_2O_2$, and $H_2O$ are used as the etchant to selectively wet etch the residual metal layer, with the result illustrated in FIG. 9e.

Embodiment 4

First, FIGS. 9a to 9c show the same processes and steps as those in the third embodiment, wherein each part with the same denotation possesses the same function.

Next, a dielectric layer is formed and patterned to form sidewall spacers 57 adjacent to each sidewall of the stacked gate 500, as shown in FIG. 8a. The dielectric layer is preferably formed by LPCVD. Anisotropically reactive ion etching (RIE) is employed to etch the dielectric layer. The spacers 57 are generally an oxide or nitride. The spacers 57 preferably have a lateral width of 5 to 50 nm.

The silicon of the silicon substrate 51 is used as etch stop during etching of the dielectric layer. Sometimes, in order to form a metal source 58A near the channel region under the stacked gate 500, a portion of the silicon can be intentionally etched (not shown) preferably to a depth of 3 to 20 nm.

Next, a metal silicide is formed to be the metal source 58A by a self-aligned silicidation or SALICIDE process, as shown in FIG. 8b. Thus, a portion of the drain region 59 uncovered by the spacer 57 is converted to a metal silicide 62. The metal silicide 62 is surrounded by highly n doped drain region 59 so actions of the device will not be affected.

Embodiment 5

FIGS. 10a–10d are cross-sections of process steps used to form a structure of nonvolatile memory in accordance with embodiment 5 according to the present invention.

Figure 10A:
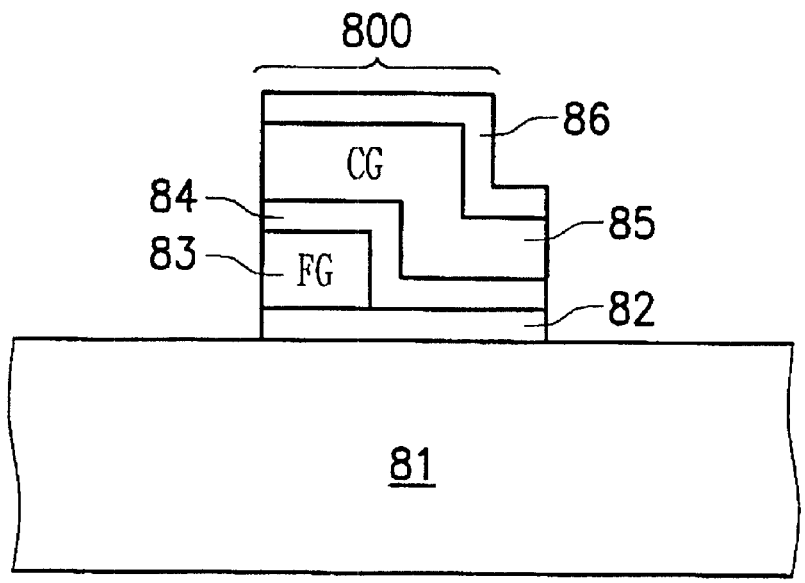
FIGS. 10a through 10d illustrate, in cross section, the process of embodiment 5 according to the present invention.

This embodiment begins by providing a p type silicon substrate 81 having a split gate 800. The split gate 800 is comprised of a tunneling dielectric layer 82, a floating gate (FG) 83, a dielectric layer 84, a control gate (CG) 85 and a capping dielectric layer 86 as shown in FIG. 10a.

Figure 10B:
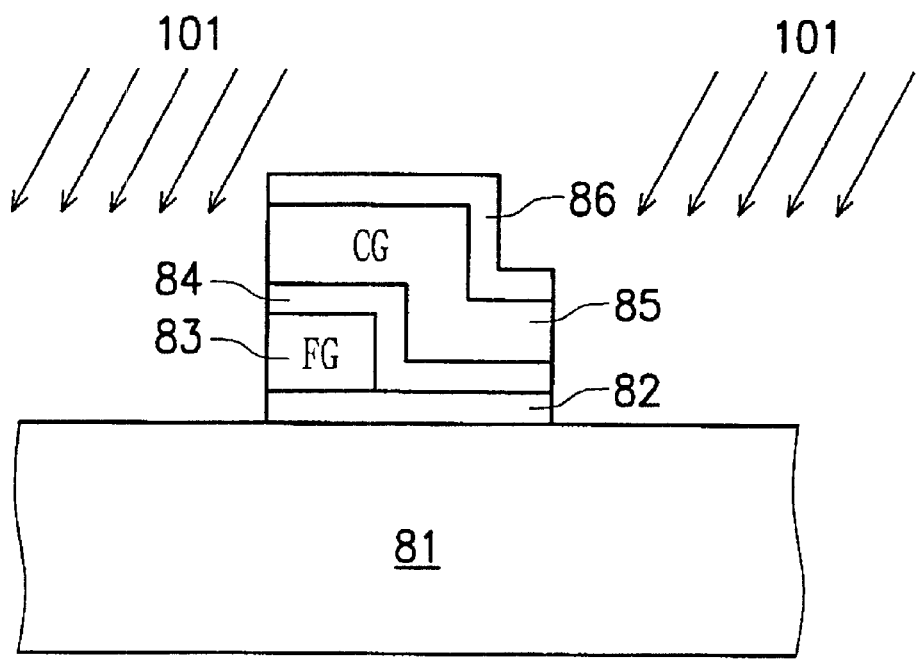
Figure 10C:
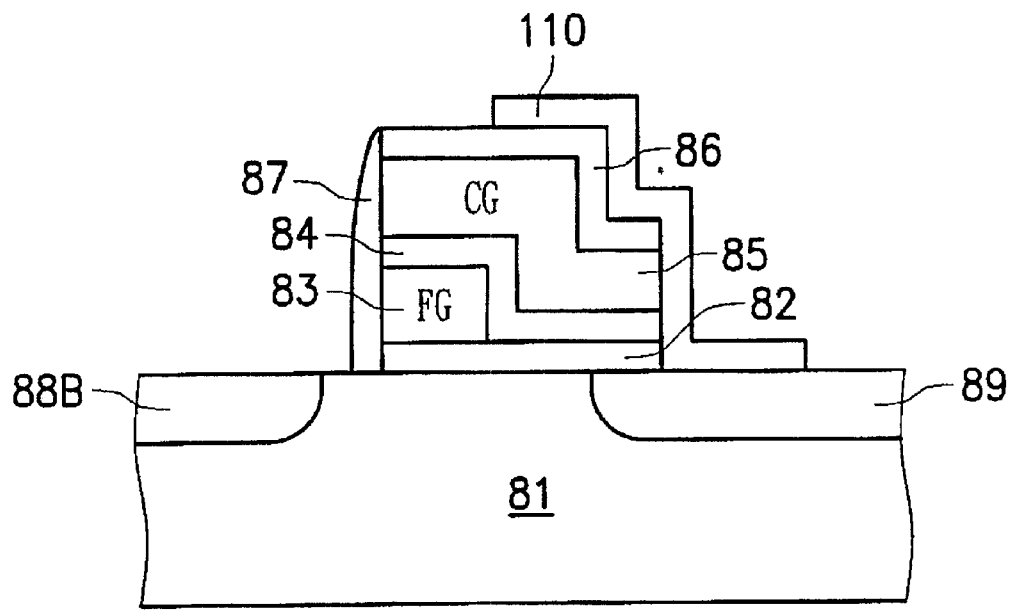

Referring to FIG. 10b, a tilted angle implant 101 with As or P doping is performed on the p type silicon substrate 81 to form an n doped drain region 89 and extend a portion of the drain region 89 to a channel region under the split gate 800, as shown in FIG. 10c. In implanting, an n doped source region 88B is also formed. An offset is created between the n doped source region 88B and the channel region under the split gate 800. As can also be seen from FIG. 10c, the floating gate (FG) 83 locates near the source region 88B under the control gate (CG) 85.

Angle □ of the tilted angle implant 101 can be 15 to 75 degrees, preferably 30 to 60 degrees. Dosage of the tilted angle implant 101 is between $10^{15}$ and $2 \times 10^{16}$ cm$^{-2}$, preferably between $2 \times 10^{15}$ and $2 \times 10^{16}$ cm$^{-2}$. Energy of the tilted angle implant 101 is between 10 and 150 keV, preferably between 20 and 100 keV.

An annealing treatment is then performed to activate the doping element, as shown in FIG. 10c. For example, the annealing is performed at between 700 and 950° C. with an inert gas ($N_2$ or Ar) ambient in a furnace for 10 minutes to an hour or at between 800 and 1050° C. with an inert gas ($N_2$ or Ar) ambient in a rapid thermal reactor for 1 to 60 seconds.

Next, a dielectric layer 110 is formed and patterned on the split gate 800 and the drain region 89, as shown in FIG. 10c. The dielectric layer 110 is preferably formed by LPCVD. Anisotropically reactive ion etching (RIE) is employed to etch the dielectric layer 110, and thus a spacer 87 is formed on a sidewall adjacent to the source region 58B of the split gate 800. The dielectric layer 110 and the spacer 87 are generally an oxide or nitride. The spacer 67 preferably has a lateral width of 5 to 50 nm.

The silicon of the silicon substrate 81 is used as etch stop during etching of the dielectric layer 110. Sometimes, in order to form a metal source 88A near the channel region under the split gate 800, a portion of the silicon can be intentionally etched (not shown) preferably to a depth of 3 to 20 nm.

Figure 10D:
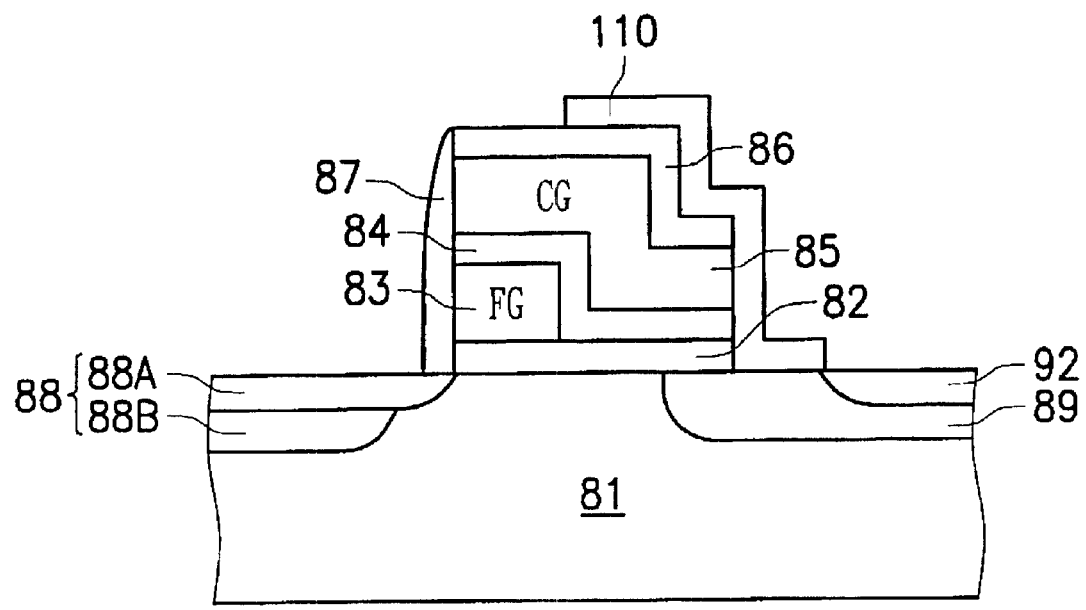

Next, a metal silicide is formed to be the metal source 88A by a self-aligned silicidation or SALICIDE process, as shown in FIG. 10d. Thus, a portion of the drain region 89 uncovered by the dielectric layer 110 is then converted to a metal silicide 92. The metal silicide 92 is surrounded by highly n doped drain region 89 so actions of the device will not be affected.

Embodiment 6

FIGS. 10a to 10b show the same processes and steps as those in the fifth embodiment, wherein each part with the same denotation possesses the same function.

Figure 11A:
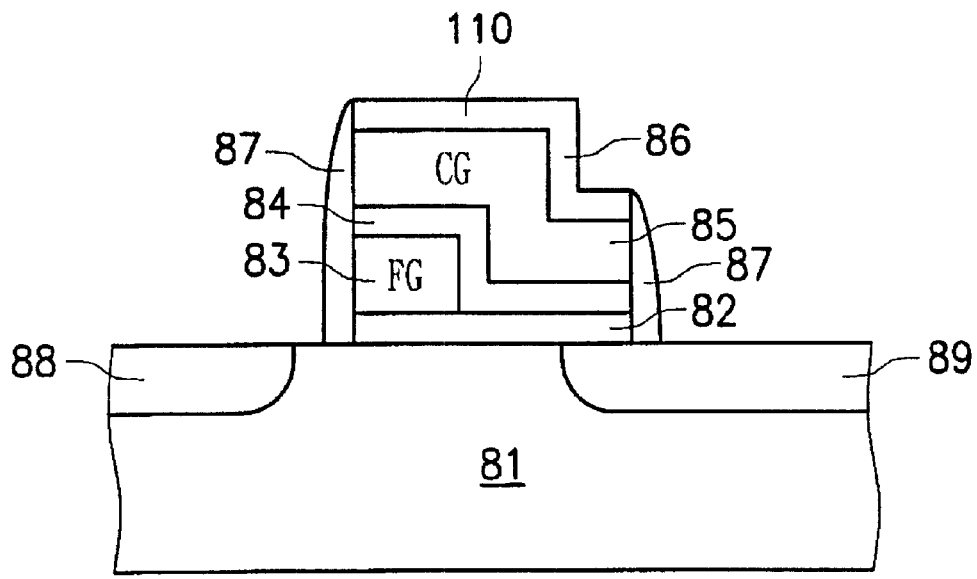
FIGS. 11a through 11b illustrate, in cross section, the process of embodiment 6 according to the present invention.

Next, a dielectric layer is formed and patterned to form sidewall spacers 87 adjacent to each sidewall of the split gate 800, as shown in FIG. 11a. The dielectric layer is preferably formed by LPCVD. Anisotropically reactive ion etching (RIE) is employed to etch the dielectric layer. The spacers 87 are generally an oxide or nitride. The spacers 87 preferably have a lateral width of 5 to 50 nm.

The silicon of the silicon substrate 81 is used as etch stop during etching of the dielectric layer. Sometimes, in order to form a metal source 88A near the channel region under the split gate 800, a portion of the silicon can be intentionally etched (not shown) preferably to a depth of 3 to 20 nm.

Figure 11B:
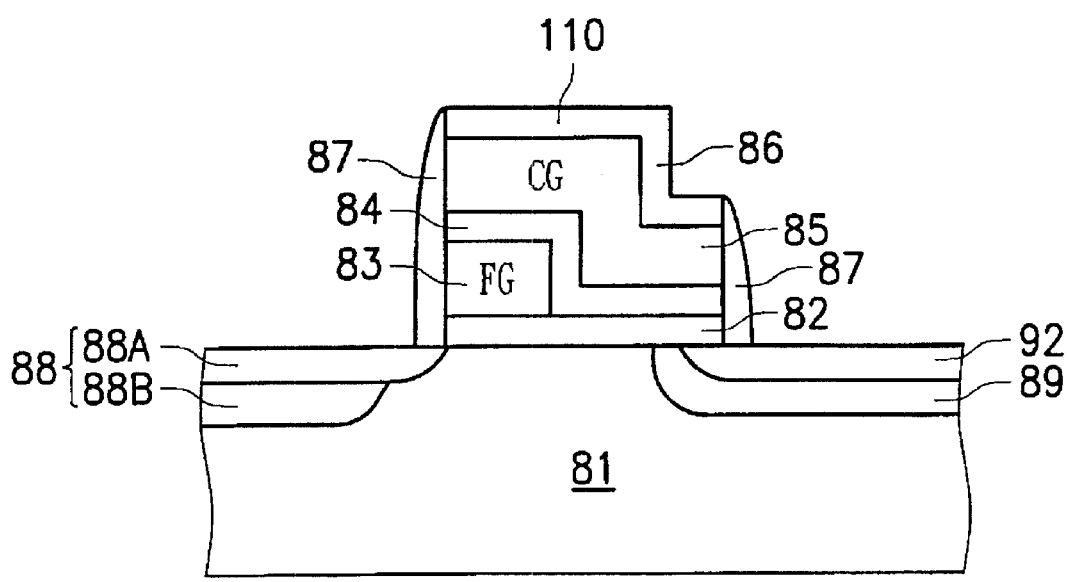

Next, a metal silicide is formed to be the metal source 88A by a self-aligned silicidation or SALICIDE process, as shown in FIG. 11b. Thus, a portion of the drain region 89 uncovered by the spacer 87 is then converted to a metal silicide 92. The metal silicide 92 is surrounded by highly n doped drain region 89 so actions of the device will not be affected.

Embodiment 7

FIGS. 12a–12d are cross-sections of process steps used to form a structure of nonvolatile memory in accordance with embodiment 7 according to the present invention.

Figure 12A:
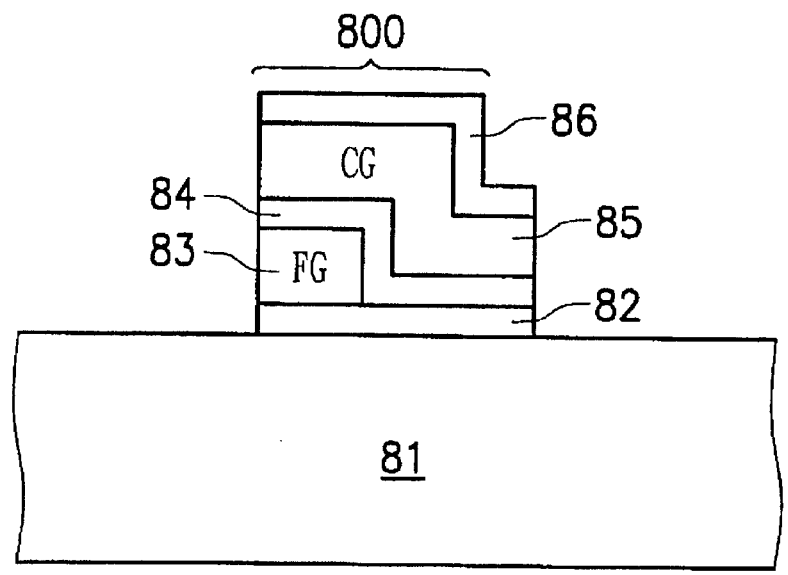
FIGS. 12a through 12d illustrate, in cross section, the processes of embodiment 7 and embodiment 8 according to the present invention.

This embodiment begins by providing a p type silicon substrate 81 having a split gate 800. The split gate 800 is comprised of a tunneling dielectric layer 82, a floating gate (FG) 83, a dielectric layer 84, a control gate (CG) 85 and a capping dielectric layer 56 as shown in FIG. 12a.

Figure 12B:
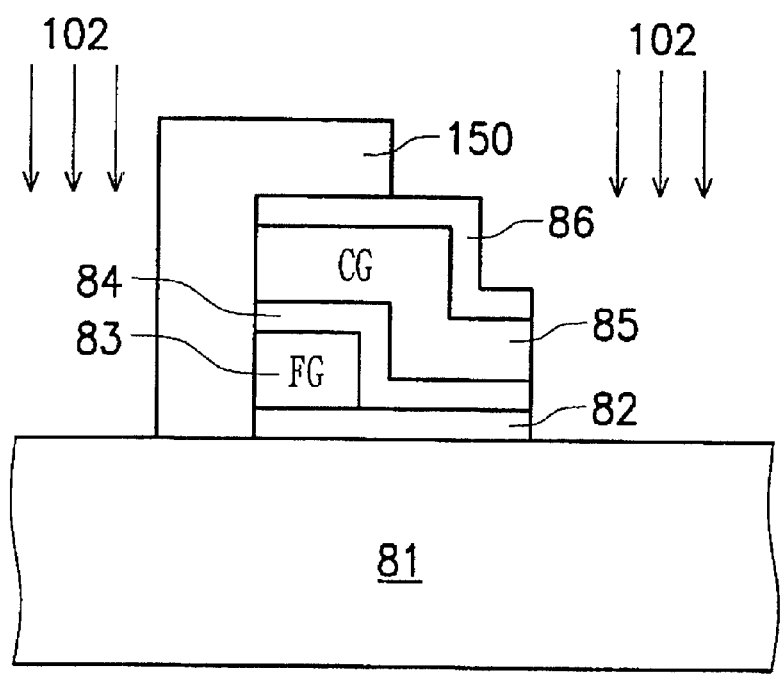
Figure 12C:
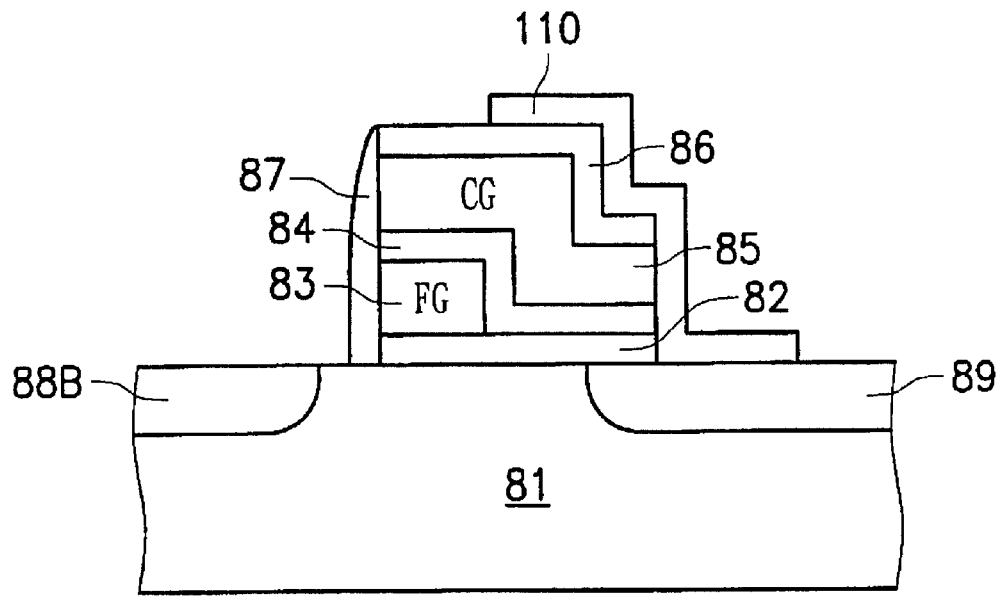

Referring to FIG. 12b, a mask layer 150 is formed on the p type silicon substrate 81. A portion of the split gate 800 adjacent to a source region of the p type silicon substrate 81 and a portion of the source region adjacent to the split gate 800 are covered by the mask layer 150. An implant 102 with As or P doping is performed on the p type silicon substrate 81 to form an n doped drain region 89 and extend a portion of the drain region 89 to a channel region under the split gate 800, as shown in FIG. 12c. In implanting, an n doped source region 88B is also formed by some dosage. An offset is created between the n doped source region 88B and the channel region under the split gate 800.

Angle □ of the tilted angle implant 102 can be 0 to 45 degrees, preferably 0 to 15 degrees. Dosage of the tilted angle implant 102 is between $10^{15}$ and $2\times10^{16}$ cm$^{-2}$, preferably between $2\times10^{15}$ and $2\times10^{16}$ cm$^{-2}$. Energy of the tilted angle implant 102 is between 10 and 150 keV, preferably between 20 and 100 keV.

An annealing treatment is then performed to activate the doping element, as shown in FIG. 12c. For example, the annealing is performed at between 700 and 950° C. with an inert gas ($N_2$ or Ar) ambient in a furnace for 10 minutes to an hour or at between 800 and 1050° C. with an inert gas ($N_2$ or Ar) ambient in a rapid thermal reactor for 1 to 60 seconds.

Next, a dielectric layer 110 is formed and patterned on the split gate 800 and the drain region 89, as shown in FIG. 12c. The dielectric layer 110 is preferably formed by LPCVD. Anisotropically reactive ion etching (RIE) is employed to etch the dielectric layer 110, and thus a spacer 87 is formed on a sidewall adjacent to the source region 58B of the split gate 800. The dielectric layer 110 and the spacer 87 are generally an oxide or nitride. The spacer 87 preferably has a lateral width of 5 to 50 nm.

The silicon of the silicon substrate 81 is used as etch stop during etching of the dielectric layer 110. Sometimes, in order to form a metal source 88A near the channel region under the split gate 800, a portion of the silicon can be intentionally etched (not shown) preferably to a depth of 3 to 20 nm.

Figure 12D:
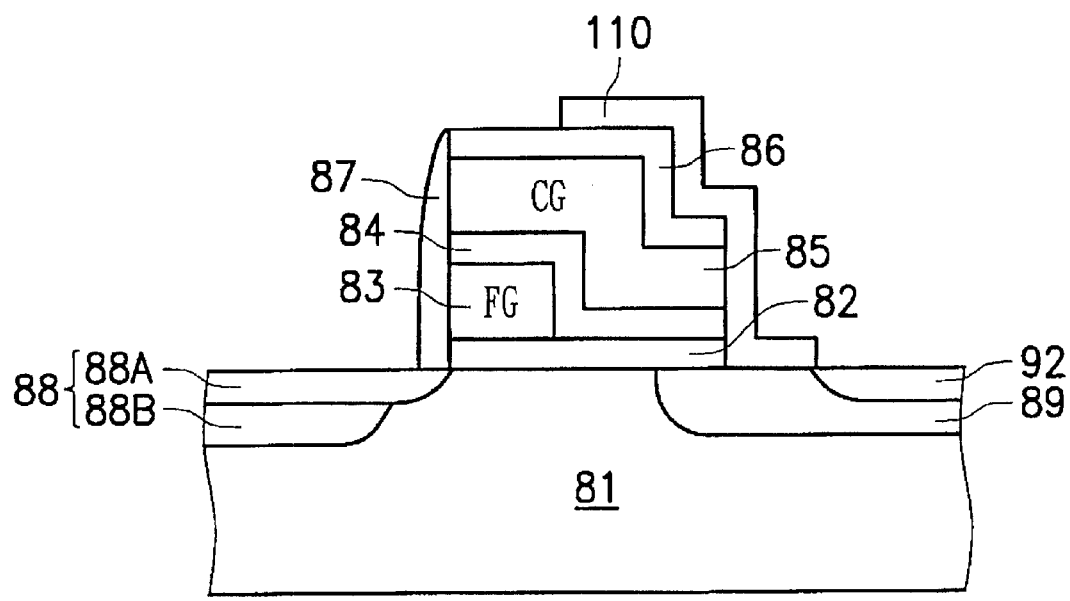

Next, a metal silicide is formed to be the metal source 88A by a self-aligned silicidation or SALICIDE process, as shown in FIG. 12d. Thus, a portion of the drain region 89 uncovered by the dielectric layer 110 is then converted to a metal silicide 92. The metal silicide 92 is surrounded by highly n doped drain region 89 so actions of the device will not be affected.

Embodiment 8

FIGS. 12a to 12b show the same processes and steps as those in the seventh embodiment, wherein each part with the same denotation possesses the same function.

A dielectric layer is formed and patterned to form sidewall spacers 87 adjacent to each sidewall of the split gate 800, as shown in FIG. 11a. The dielectric layer is preferably formed by LPCVD. Anisotropically reactive ion etching (RIE) is employed to etch the dielectric layer. The spacers 87 are generally an oxide or nitride. The spacers 87 preferably have a lateral width of 5 to 50 nm.

The silicon of the silicon substrate 81 is used as etch stop during etching of the dielectric layer. Sometimes, in order to form a metal source 88A near the channel region under the split gate 800, a portion of the silicon can be intentionally etched (not shown) preferably to a depth of 3 to 20 nm.

Next, a metal silicide is formed to be the metal source 88A by a self-aligned silicidation or SALICIDE process, as shown in FIG. 11b. Thus, a portion of the drain region 89 uncovered by the spacer 87 is then converted to a metal silicide 92. The metal suicide 92 is surrounded by highly n doped drain region 89 so actions of the device will not be affected.

The tunneling dielectric layer of the method of manufacturing nonvolatile memory according to the invention generally consists of a $SiO_2$ layer, while SiON, $Si_3N_4$, $HfO_2$ or $ZrO_2$ can also be employed. The floating gate is preferably polysilicon. The dielectric layer is preferably $SiO_2$, ONO, SiON, $Si_3N_4$, $HfO_2$ or $ZrO_2$. The control gate is preferably polysilicon, metal or polysilicon/metal stacked layer. If the control gate is metal, then $WSi_2$, $CoSi_2$, $TiSi_2$, W, W/WN or W/TiN can be employed. The surface metal portion of the source region is preferably metal silicide. The capping dielectric layer formed on the control gate is preferably SiON or $Si_3N_4$. A metal silicide can further be formed in the drain region and surrounded by highly n doped region.

While the invention has been particularly shown and described with the reference to the preferred embodiments thereof, it will be understood by those skilled in the art that various changes in form and details may be made without departing from the spirit and scope of the invention.

What is claimed is:

1. A structure of nonvolatile memory, comprising:

a p type silicon substrate;

a split gate comprising a tunneling dielectric layer, a floating gate, a dielectric layer and a control gate formed on the p type silicon substrate;

a source region located at a first side of the split gate adjacent to the floating gate in the p type silicon substrate;

a drain region located at a second side of the split gate in the p type silicon substrate; and a channel region located between the source region and the drain region;

wherein:

the floating gate is located at a first side under the control gate and isolated with the control gate via the dielectric layer, a second side of the control gate extending on the p type silicon substrate and isolated with the p type silicon substrate via the dielectric layer and the tunneling dielectric layer;

the drain region is a highly n doped region and diffuses beneath the split gate;

the source region comprises a surface metal portion and a highly n doped region, wherein the surface metal portion and the channel region forming a Schottky barrier, the highly n doped region locates under the surface metal portion, contacts with the p type silicon substrate and has an offset with the channel region.

2. Tho structure as recited in claim 1, wherein the floating gate is polysilicon.

3. The structure as recited in claim 1, wherein the control gate further comprises a capping dielectric layer.

4. The structure as recited in clam 1, wherein the drain region further comprising a metal silicide, the metal silicide within the drain region is surrounded by highly n doped region.

5. The structure as recited in claim 1, wherein the surface metal portion of the source region is metal silicide.

6. The structure as recited in claim 5, wherein the metal silicide is selected from the group consisting of $NiSi_2$, $CoSi_2$, $TiSi_2$, $PtSi_2$ and $ErSi_2$.

* * * * *